(12) United States Patent
Nagatomo et al.

(10) Patent No.: US 9,786,512 B2
(45) Date of Patent: *Oct. 10, 2017

(54) ETCHING METHOD (71) Applicant: TOKYO ELECTRON LIMITED, Tokyo (JP)

(72) Inventors: Yu Nagatomo, Miyagi (JP); Ryuuu Ishita, Miyagi (JP); Daisuke Tamura, Miyagi (JP); Kousuke Koiwa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/090,726

(22) Filed: Apr. 5, 2016

(65) Prior Publication Data

US 2016/0293440 A1 Oct. 6, 2016

(30) Foreign Application Priority Data

Apr. 6, 2015 (JP) ................... 2015-077586

(51) Int. Cl.
| | | |
|---|---|---|
| *H01L 21/302* | (2006.01) | |
| *H01L 21/461* | (2006.01) | |
| *H01L 21/311* | (2006.01) | |
| *H01L 27/115* | (2017.01) | |
| *H01L 21/308* | (2006.01) | |

(Continued)

(52) U.S. Cl.
CPC .. *H01L 21/31116* (2013.01); *H01J 37/32724* (2013.01); *H01L 21/308* (2013.01); *H01L 21/3065* (2013.01); *H01L 21/31144* (2013.01); *H01L 21/67109* (2013.01); *H01L 27/115* (2013.01); *H01L 27/1157* (2013.01); *H01L 27/11556* (2013.01); *H01L 27/11573* (2013.01);

(Continued)

(58) Field of Classification Search
None
See application file for complete search history.

(56) References Cited

U.S. PATENT DOCUMENTS

2013/0043455 A1* 2/2013 Bateman ............. H01L 27/2454
257/5
2013/0059450 A1 3/2013 Le Gouil et al.
(Continued)

*Primary Examiner* — Stephanie Duclair
(74) *Attorney, Agent, or Firm* — Rothwell, Figg, Ernst & Manbeck, P.C.

(57) ABSTRACT

Provided is an etching method for simultaneously etching first and second regions of a workpiece. The first region has a multilayered film configured by alternately laminating a silicon oxide film and a silicon nitride film and a second region has a silicon oxide film having a film thickness that is larger than that of the silicon oxide film in the first region. A mask is provided on the workpiece to at least partially expose each of the first and second regions. In the etching method, plasma of a first processing gas containing fluorocarbon gas, hydrofluorocarbon gas, and oxygen gas is generated within a processing container of a plasma processing apparatus. Subsequently, plasma of a second processing gas containing fluorocarbon gas, hydrofluorocarbon gas, oxygen gas, and a halogen-containing gas is generated within the processing container. Subsequently, plasma of a third processing gas containing oxygen gas is generated within the processing container.

15 Claims, 7 Drawing Sheets

(51) Int. Cl.
*H01L 27/11556* (2017.01)
*H01L 21/3065* (2006.01)
*H01J 37/32* (2006.01)
*H01L 21/67* (2006.01)
*H01L 27/1157* (2017.01)
*H01L 27/11573* (2017.01)
*H01L 27/11575* (2017.01)
*H01L 27/11582* (2017.01)

(52) U.S. Cl.
CPC .. *H01L 27/11575* (2013.01); *H01L 27/11582* (2013.01)

(56) References Cited

U.S. PATENT DOCUMENTS

2013/0102157 A1\* 4/2013 Ozu ............... H01L 29/6656
438/723
2015/0056817 A1\* 2/2015 Ogawa ............ H01J 37/32027
438/723

\* cited by examiner

ETCHING METHOD

CROSS-REFERENCE TO RELATED APPLICATIONS

This application is based on and claims priority from Japanese Patent Application No. 2015-077586, filed on Apr. 6, 2015, with the Japan Patent Office, the disclosure of which is incorporated herein in its entirety by reference.

TECHNICAL FIELD

Exemplary embodiments of the present disclosure are related to an etching method. In particular, the exemplary embodiments are related to a method for simultaneously etching a first region having a multilayered film configured by alternately laminating a silicon oxide film and a silicon nitride film, and a second region including a silicon oxide film having a film thickness larger than that of the silicon oxide film of the first region.

BACKGROUND

A NAND type flash memory device having a three-dimensional structure has been known as a kind of semiconductor device. In manufacturing the NAND type flash memory device having a three-dimensional structure, a step of etching a multilayered film configured by alternately laminating a silicon oxide film and a silicon nitride film is performed so as to form a deep hole in the multilayered film. Such an etching is disclosed in U.S. Patent Application Publication No. 2013/0059450.

Specifically, U.S. Patent Publication No. 2013/0059450 discloses a method for etching a multilayered film by exposing an object to be processed ("workpiece") having a mask on a multilayered film to plasma of a processing gas.

By the way, a workpiece, which is an object to be etched, may include a first region including a multilayered film configured by alternately laminating a silicon oxide film and a silicon nitride film and a second region including a silicon oxide film having a film thickness larger than that of the silicon oxide film of the first region. It is requested that a space such as, for example, a hole be simultaneously formed in both of the first region and the second region by etching the workpiece. In such etching, a mask is formed on the first region and the second region, and the first region and the second region are etched in a portion exposed form an opening of the mask.

SUMMARY

According to one aspect of the present disclosure, there is provided a method for simultaneously etching a first region and a second region of an object to be processed (hereinafter, referred to as a "workpiece"). The first region includes a multilayered film that is configured by alternately laminating a silicon oxide film and a silicon nitride film. The second region includes a silicon oxide film having a film thickness larger than that of the silicon oxide film of the first region. The workpiece is provided with a mask to provide an opening on each of the first region and the second region. The method includes: (a) generating plasma of a first processing gas that contains fluorocarbon gas, hydrofluorocarbon gas, and oxygen gas, within a processing container of a plasma processing apparatus in which the workpiece is provided (hereinafter, step (a) will be referred to as a "first step"); (b) generating plasma of a second processing gas which contains fluorocarbon gas, hydrofluorocarbon gas, oxygen gas, and halogen-containing gas, within the processing container of the plasma processing, the halogen-containing gas being a gas that forms a reaction product of a halogen element and silicon so as to form a deposit on a surface of the workpiece (hereinafter, step (b) will be referred to as a "second step"), and (c) generating plasma of a third processing gas containing oxygen gas within the processing container of the plasma processing (hereinafter, step (c) will be referred to as a "third step"). In the method, a sequence, which includes the first step, the second step, and the third step are performed plural times.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

It is considered that a processing gas which contains fluorocarbon gas and hydrofluorocarbon gas is used for etching the first region and the second region described above. However, in the etching using such a processing gas, a width of a space to be formed by the etching may be widened in a portion of the space in the depth direction thereof. That is, the verticality of a side wall surface defining the space formed by the etching may be lowered. Further, an opening of a mask may be reduced by a material, such as, for example, fluorocarbon, and the opening of the hole may be closed in some cases.

Accordingly, in a technique for simultaneously etching a first region having a multilayered film configured by alternately laminating a silicon oxide film and a silicon nitride film and a second region including a silicon oxide film having a film thickness larger than that of the silicon oxide film of the first region, it is requested that the verticality of a side wall surface formed by the etching be improved and the reduction of an opening of a mask be suppressed.

According to one aspect of the present disclosure, there is provided a method for simultaneously etching a first region and a second region of an object to be processed (hereinafter, referred to as a "workpiece"). The first region includes a multilayered film that is configured by alternately laminating a silicon oxide film and a silicon nitride film. The second region includes a silicon oxide film having a film thickness larger than that of the silicon oxide film of the first region. The workpiece is provided with a mask to provide an opening on each of the first region and the second region. The method includes: (a) generating plasma of a first processing gas that contains fluorocarbon gas, hydrofluorocarbon gas, and oxygen gas, within a processing container of a plasma processing apparatus in which the workpiece is provided (hereinafter, step (a) will be referred to as a "first step"); (b) generating plasma of a second processing gas which contains fluorocarbon gas, hydrofluorocarbon gas, oxygen gas, and halogen-containing gas, within the processing container of the plasma processing, the halogen-containing gas being a gas that forms a reaction product of a halogen element and silicon so as to form a deposit on a surface of the workpiece (hereinafter, step (b) will be referred to as a "second step"), and (c) generating plasma of a third processing gas containing oxygen gas within the processing container of the plasma processing (hereinafter, step (c) will be referred to as a "third step"). In the method, a sequence, which includes the first step, the second step, and the third step are performed plural times.

In the method according to one aspect of the present disclosure, the first region and the second region are simultaneously etched in the first step. In the second step, a reaction product of a halogen element and silicon of the workpiece is generated and the reaction product forms a deposit on a side wall surface formed by the etching. The side wall surface formed in each of the first region and the second region is suppressed from being etched in a horizontal direction by the deposit. According to the method, the verticality of the side wall surface to be formed by the etching is improved. Further, in the first step and the second step, a material such as, for example, fluorocarbon is attached to the surface of the mask. The amount of the material attached to the surface of the mask is reduced by active species derived from the oxygen gas contained in the processing gases used in the first step and the second step. The amount of the material attached to the surface of the mask is reduced also by the plasma of the oxygen gas generated in the third step. Accordingly, the openings of the mask are suppressed from being reduced.

In an exemplary embodiment of the present disclosure, as the number of times of execution of a sequence is increased, the flow rate of the oxygen gas of the first processing gas and the flow rate of the oxygen gas of the second processing gas may increase in a stepwise manner. As the number of times of execution of the sequence increases, the depth of the space formed in each of the first region and the second region becomes deeper. When the depth of the space becomes deeper, fluorocarbon, which contributes to etching, is easily attached to the wall surface in the vicinity of the opening of the mask, rather than infiltrating into the deep portion of the space. According to the exemplary embodiment, since the flow rate of the oxygen gas of the first processing gas and the flow rate of the oxygen gas of the second processing gas increase as the number of times of execution of the sequence is increased, it becomes possible to effectively remove the material deposited on the wall surface in the vicinity of the opening of the mask when the space becomes deeper. Further, the flow rate of the oxygen gas of the first processing gas and the flow rate of the oxygen gas of the second processing gas may increase twice or more in a stepwise manner for the entire period during which the sequence are executed plural times.

In an exemplary embodiment of the present disclosure, the temperature of the workpiece may increase as the number of times of execution of the sequence increases. When the temperature of the workpiece is low, the amount of fluorocarbon to be attached to the wall surface in the vicinity of the opening of the mask becomes larger than the amount of fluorocarbon infiltrating into the space. In the meantime, when the temperature of the workpiece is high, the amount of fluorocarbon to be attached to the wall surface in the vicinity of the opening of the mask decreases and the amount of fluorocarbon infiltrating into the space increases. In the exemplary embodiment, since the temperature of the workpiece is raised as the number of times of execution of the sequence increases, that is, the depth of the space increases, fluorocarbon may be suppressed from being attached to the wall surface in the vicinity of the opening of the mask and supply fluorocarbon up to a deep portion of the deep space. Accordingly, etching for the deep space is effectively performed. Further, the temperature of the workpiece may be raised at least twice in a stepwise manner for the entire period during which the sequences is executed plural times.

In an exemplary embodiment, the second processing gas may contain the first processing gas and the halogen-containing gas. That is, the first processing gas may be supplied into the processing container during the first step and the second step and the halogen-containing gas may be added to the first processing gas in the second step.

In an exemplary embodiment, the pressure inside the processing container and the power for generating plasma may be maintained constant during each of the times of execution of the sequence. According to the exemplary embodiment, since the pressure inside the processing container and the power for generating plasma are maintained constant during the first step to the third step in each of the times of execution of the sequence, the time required to make plasma stable may be shortened.

In an exemplary embodiment, a time length of the first step may be longer than that of the second step. According to the exemplary embodiment, since the time length of the first step during which etching is mainly progressed is longer than that of the second step during which deposits are formed, the etching rate in each of the times of execution of the sequence becomes high.

As described above, in a technique for simultaneously etching a first region having a multilayered film configured by alternately laminating a silicon oxide film and a silicon nitride film and a second region including a silicon oxide film having a film thickness larger than that of the silicon oxide film of the first region, the verticality of a side wall surface formed by the etching can be improved and the openings of the mask can be suppressed from being reduced.

Hereinafter, various exemplary embodiments will be described with reference to the accompanying drawings. Further, the same or substantially the same portions in respective drawings will be denoted by the same reference numerals.

Figure 1:
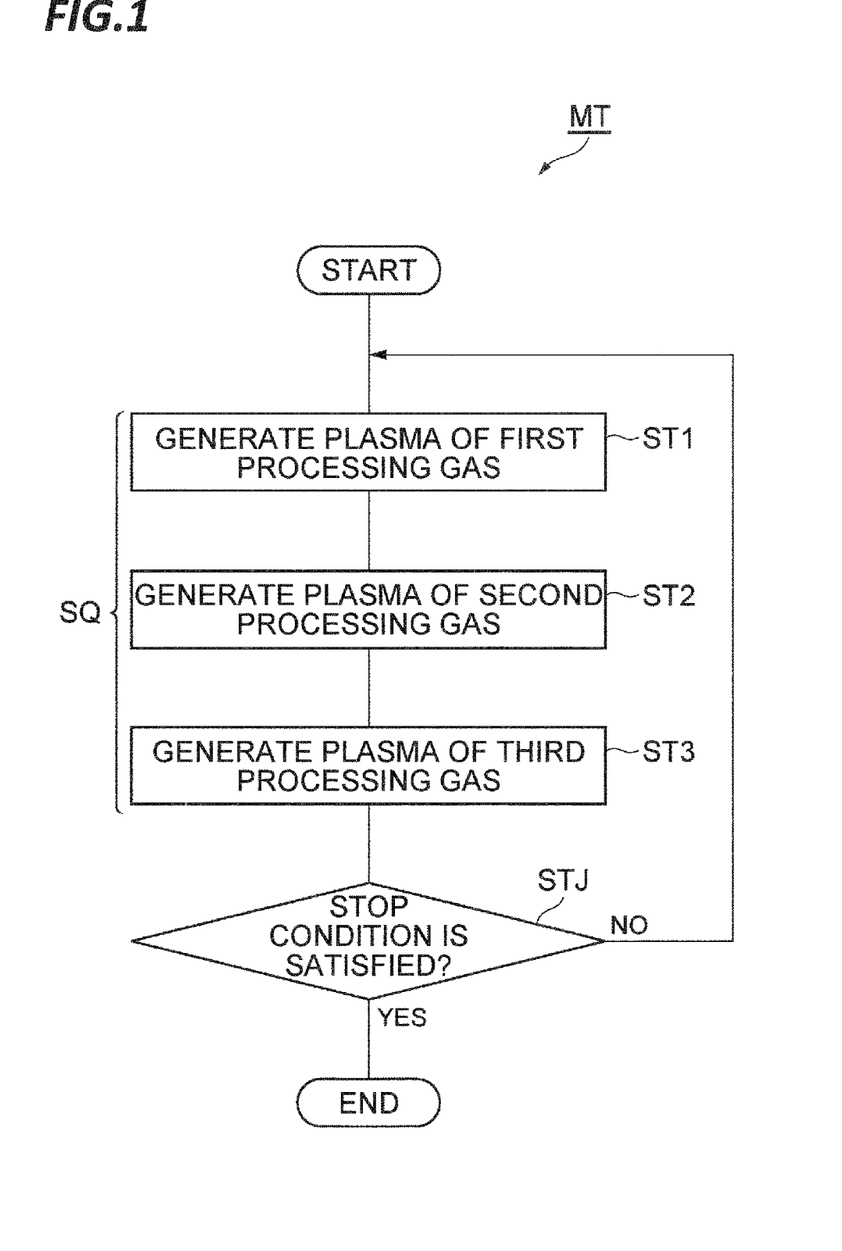
FIG. 1 is a flowchart illustrating an etching method according to an exemplary embodiment of the present disclosure.

FIG. 1 is a flowchart illustrating an etching method according to an exemplary embodiment of the present disclosure. The method MT illustrated in FIG. 1 is a method for etching both of a first region and a second region so as to form a space such as, for example, a hole. The method MT may be used for manufacturing, for example, a NAND flash memory having a three-dimensional structure.

Figure 2:
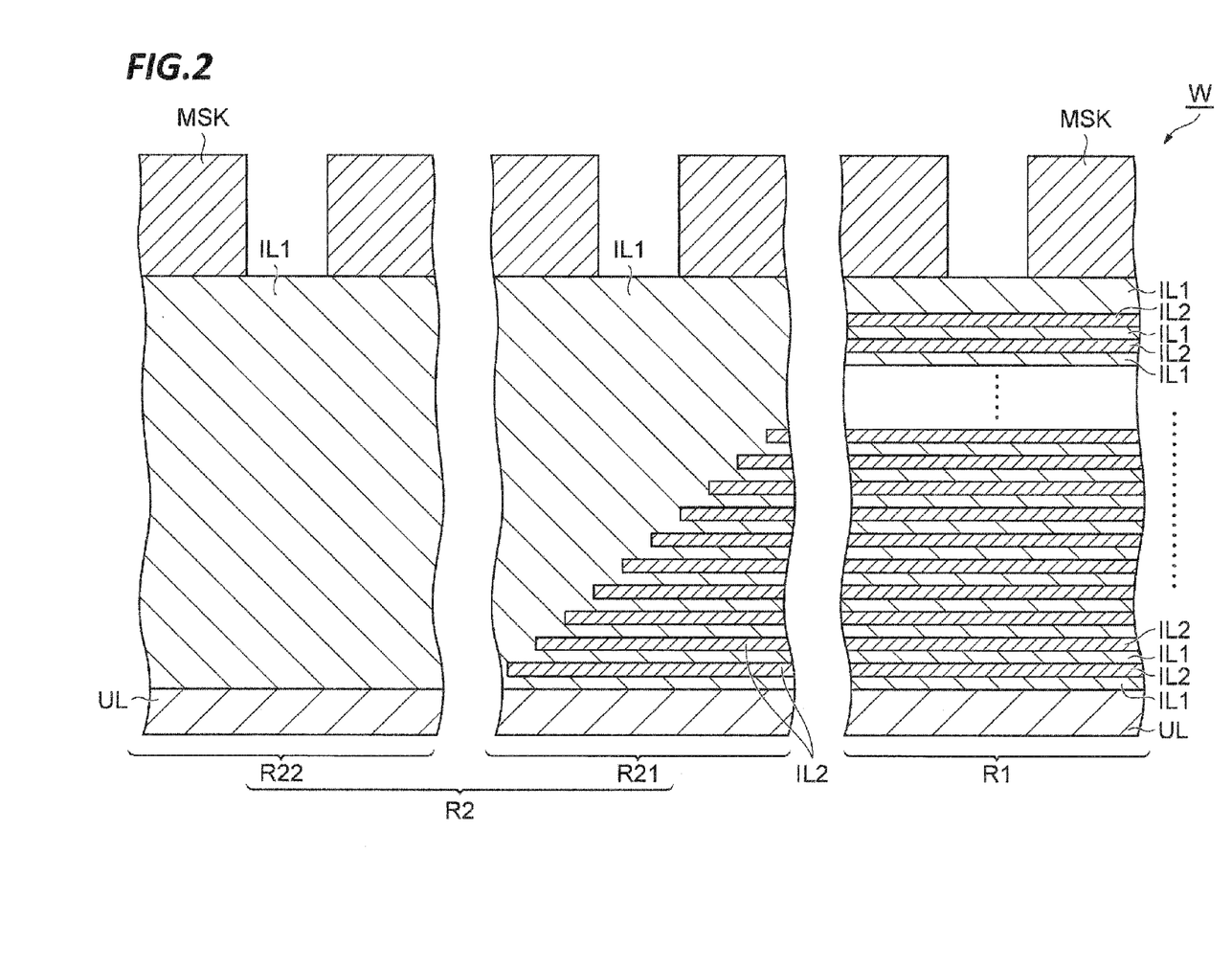
FIG. 2 is a cross-sectional view exemplifying a workpiece to which the etching method illustrated in FIG. 1 is applied.

FIG. 2 is a cross-sectional view illustrating a workpiece to which the etching method illustrated in FIG. 1 is applied. The workpiece (hereinafter, referred to as a "wafer W") illustrated in FIG. 2 includes an underlayer UL, a first region R1, a second region R2, and a mask MSK. The underlayer UL may be a polycrystalline silicon layer that is formed on, for example, a substrate. The first region R1 and the second region R2 are formed on the underlayer UL.

The first region R1 is configured by a multilayered film. The multilayered film is configured by alternately laminating a silicon oxide film IL1 and a silicon nitride film IL2. The thickness of the silicon oxide film IL1 is, for example, 5 nm to 50 nm and the thickness of the silicon nitride film IL2 is, for example, 10 nm to 75 nm. In an exemplary embodiment, a total of 24 layers or more of silicon oxide films IL1 and silicon nitride films IL2 may be laminated.

The second region R2 includes a silicon oxide film having the film thickness larger than that of the silicon oxide films IL1 of the first region R1. In an exemplary embodiment, the second region includes a partial region R21 and a partial region R22. Some of the silicon nitride films IL2 of the first region R1 extend into the partial region R21 in a direction orthogonal to the lamination direction of the multilayered film. As illustrated in FIG. 2, a plurality of silicon nitride films IL2 extending from the first region R1 into the partial region R21 are terminated in the partial region R21 so as to exhibit a stepwise shape. A portion except for the silicon nitride films IL2 in the partial region R21 is configured by the silicon oxide film IL1. Further, the partial region R22 is configured by a single layer of the silicon oxide film IL1. The thickness of the second region R2 configured as described above is substantially the same as that of the first region R1.

A mask MSK is formed on the first region R1 and the second region R2. An opening for forming a space such as, for example, a hole in the first region R1 and the second region R2 is formed in the mask MSK. The mask MSK may be made of, for example, amorphous carbon. Otherwise, the mask MSK may be made of an organic polymer.

Figure 3:
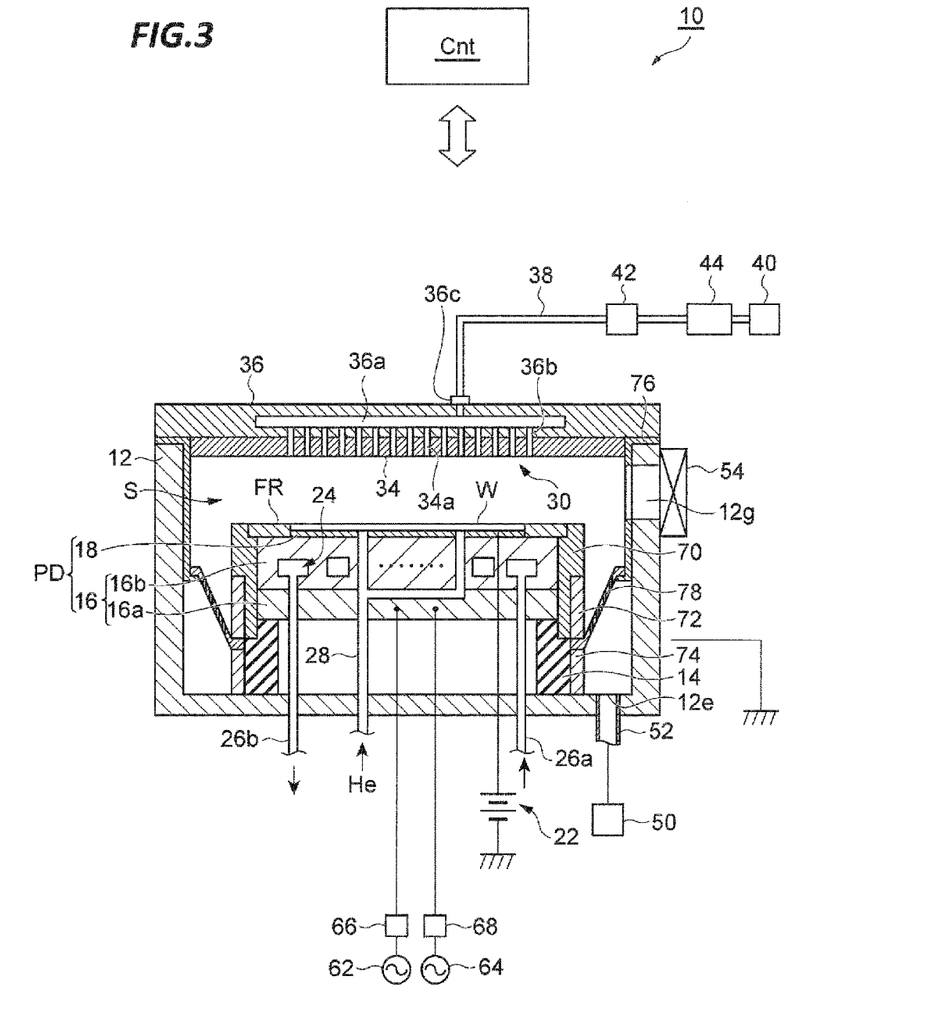
FIG. 3 is a view schematically illustrating an exemplary plasma processing apparatus that may be used for carrying out the method illustrated in FIG. 1.

Referring to FIG. 1 again, first, the wafer W illustrated in FIG. 2 is provided to the inside of a processing container of the plasma processing apparatus in the method MT. FIG. 3 is a view schematically illustrating an exemplary plasma processing apparatus that may be used for carrying out the method illustrated in FIG. 1.

The plasma processing apparatus 10 illustrated in FIG. 3 is a capacitively coupled type plasma etching apparatus, and includes a substantially cylindrical processing container 12. The inner wall surface of the processing container 12 is configured by coating ceramics such as, for example, yttria, on an anodized aluminum. The processing container 12 is grounded. A passage 12g for carrying in and out a wafer W is formed on the side wall surface of the processing container 12. The passage 12g is configured to be opened/closed by a gate valve 54.

A placement table PD is provided within the processing container 12. A support unit 14 extends from the bottom portion of the processing container 12. The support unit 14 has a substantially cylindrical shape, and is made of an insulating material. The support unit 14 supports the placement table PD.

The placement table PD is provided with a lower electrode 16 and an electrostatic chuck 18. In an exemplary embodiment, the lower electrode 16 includes a first member 16a and a second member 16b. Both of the first member 16a and the second member 16b have a substantially disk-like shape, and are made of a conductor such as, for example, aluminum. The second member 16b is provided on the first member 16a to be electrically connected thereto.

A first high frequency power source 62 is connected to the first member 16a through a matcher 66. The first high frequency power source 62 refers to a power source that generates a high frequency power for plasma generation. The first high frequency power source 62 generates a power having a frequency of 27 MHz to 100 MHz (e.g., 40 MHz). The matcher 66 refers to a circuit for matching an output impedance of the first high frequency power source 62 and an input impedance of a load side (lower electrode 16 side). Further, the first high frequency power source 62 may be connected to an upper electrode 30 through the matcher 66.

A second high frequency power source 64 is connected to the first member 16a through the matcher 68. The second high frequency power source 64 refers to a power source that generates a high frequency power for drawing ions into the wafer W. The second high frequency power source 64 generates a power having a frequency of 400 kHz to 13.56 MHz (e.g., 3 MHz). The matcher 68 refers to a circuit for matching an output impedance of the second high frequency power source 64 and the input impedance of the load side (lower electrode 16 side).

A coolant passage 24 is formed inside the second member 16b. A coolant is supplied to the coolant passage 24 through a pipe 26a from a chiller unit installed outside the processing container 12, and the coolant supplied to the coolant passage 24 is returned to the chiller unit through a pipe 26b. By controlling the temperature of the coolant circulated as described above, the temperature of the wafer W placed on the electrostatic chuck 18 is controlled.

The electrostatic chuck 18 is provided on the second member 16b. The electrostatic chuck 18 has a configuration in which a membrane electrode is interposed between a pair of insulating layers or insulation sheets. A direct current power source 22 is electrically connected to the electrostatic chuck 18 through a switch. The electrostatic chuck 18 attracts and holds the wafer W by an electrostatic force such as, for example, a Coulomb force generated by a direct voltage from a direct current power source 22. A heating element such as, for example, a heater, may be provided inside the electrostatic chuck 18.

A focus ring FR is provided around the electrostatic chuck 18, or on the second member 16b. The focus ring FR is provided to improve etching uniformity, and may be made of, for example, quartz.

Further, a gas supply line 28 is formed in the lower electrode 16 and the electrostatic chuck 18. The gas supply line 28 is configured to supply a heat transfer gas (e.g., He gas) from a heat transfer gas supply mechanism to a space between the top surface of the electrostatic chuck 18 and the rear surface of the wafer W.

The plasma processing apparatus 10 further includes an upper electrode 30. The upper electrode 30 is disposed to face the placement table PD above the placement table PD. The lower electrode 16 and the upper electrode 30 are provided in substantially parallel with each other. A processing space S used for performing a plasma processing on the wafer W is defined between the upper electrode 30 and the lower electrode 16.

The upper electrode 30 is disposed on the processing container 12 to cover an upper end opening of the processing container 12. The upper electrode 30 may include a top plate 34 and a support body 36. The top plate 34 faces the processing space S, and provides a plurality of gas ejection holes 34a. Details of the top plate 34 will be described later.

The support body 36 detachably supports the top plate 34, and may be made of a conductor such as, for example, aluminum. The support body 36 may have a water-cooled structure. A gas diffusion chamber 36a is formed inside the support body 36. A plurality of gas circulation holes 36b communicated to gas ejection holes 34a extend downward from the gas diffusion chamber 36a. Further, a gas introduction port 36c is formed in the support body 36 to guide the processing gas to the gas diffusion chamber 36a, and a gas supply pipe 38 is connected to the gas introduction port 36c.

A gas source group 40 is connected to the gas supply pipe 38 through a valve group 42 and a flow rate controller group 44. The gas source group 40 includes a plurality of gas sources. A plurality of gas sources includes a source of one or more fluorocarbon gases, a source of hydrofluorocarbon gas, a source of halogen-containing gas, a source of oxygen ($O_2$) gas, and a source of noble gas. One or more gases, for example, $C_4F_6$ gas, $C_4F_8$ gas, and $CF_4$ gas may be used as the one or more fluorocarbon gases. $CH_2F_2$ gas may be used as the hydrofluorocarbon gas. A gas, such as, for example, HBr gas, $BCl_3$ gas, $SiCl_4$ gas, or HI gas, may be used as the halogen-containing gas. An arbitrary noble gas such as, for example, He gas, Ne gas, Ar gas, or Kr gas, may be used as the noble gas.

The valve group 42 includes a plurality of valves. Further, the flow rate controller group 44 includes a plurality of flow rate controllers such as, for example, a mass flow controller (MFC). Each of the gas sources of the gas source group 40 is connected to the gas supply pipe 38 through a flow rate controller corresponding to the flow rate controller group 44 and a valve corresponding to the valve group 42. In the plasma processing apparatus 10, a gas from a selected gas source among the plurality of gas sources is introduced from the gas supply pipe 38 to the gas diffusion chamber 36a, and ejected into the processing space S through the gas circulation hole 36b and the gas ejection hole 34a.

As illustrated in FIG. 3, a vertically extending cylindrical member 70 is provided on the periphery of the placement table PD. The cylindrical member 70 is made of an insulator such as, for example, quartz, and is provided along an outer peripheral surface of the placement table PD. Further, a cylindrical member 72 and a cylindrical member 74 are provided around the cylindrical member 70 and the support unit 14. The cylindrical member 72 is provided above the cylindrical member 74. Both of the cylindrical member 72 and the cylindrical member 74 are made of a conductor such as, for example, aluminum. The surfaces of the cylindrical member 72 and the cylindrical member 74 are coated with ceramics such as, for example, yttria.

The upper end of the support member 76 is supported on the side wall of the processing container 12. The support member 76 is made of a conductor such as, for example, aluminum, and the surface of the support member 76 is coated with ceramics such as, for example, yttria. The support member 76 extends downward along the inner surface of the side wall of the processing container 12. The outer end portion of a baffle member 78 is supported on the lower end the support member 76. Further, the inner end portion of the baffle member 78 is supported by being sandwiched between the cylindrical member 72 and the cylindrical member 74.

The baffle member 78 is provided in an exhaust passage interposed between the sidewall of the processing container 12 and the placement table PD. A plurality of through-holes are formed in the baffle member 78. The baffle member 78 is made of a conductor such as, for example, aluminum. The surface of the support member 78 is coated with ceramics such as, for example, yttria. In an exemplary embodiment, the baffle member 78 is inclined upwardly from the inner end portion thereof toward the outer end portion. According to the baffle member 8, the volume of the processing space S in which plasma is generated is reduced.

An exhaust port 12e is formed below the baffle member 78 and on the bottom portion of the processing container 12. An exhaust device 50 is connected to the exhaust port 12e through an exhaust pipe 52. The exhaust device 50 includes a pressure control valve and a decompressurizing pump such as, for example, a turbo molecular pump.

Further, the plasma processing apparatus 10 may further include a controller Cnt. The controller Cnt may be a computer device equipped with, for example, a processor, a storage unit, an input device, and a display device, and is able to control each unit of the plasma processing apparatus 10. With the controller Cnt, an operator may perform, for example, a command input operation using the input device in order to manage the plasma processing apparatus 10, and may also visualize an operation state of the plasma processing apparatus 10 to display the operation state by the display unit. A control program for controlling various processes executed in the plasma processing apparatus 10 by a processor or a program for causing each unit of the plasma processing apparatus 10 to execute a process according to a process condition, that is, a process recipe, is stored in the storage unit of the controller Cnt. In an exemplary embodiment, the controller Cnt controls each unit of the plasma processing apparatus 10 according to the process recipe prepared for the execution of the method MT.

In the plasma processing apparatus 10, a processing gas from a gas source selected from a plurality of gas sources of the gas source group 40 is supplied to the processing space S and a pressure of the processing space S is set to a predetermined pressure by the exhaust device 50. In addition, the high frequency power from the first high frequency power source 62 is supplied to the lower electrode 16, and the high frequency bias power from the second high frequency power source 64 is supplied to the lower electrode 16. Accordingly, the processing gas is excited in the processing space S. Also, etching is performed on the wafer W by active species, such as, for example, ions.

Figure 4:
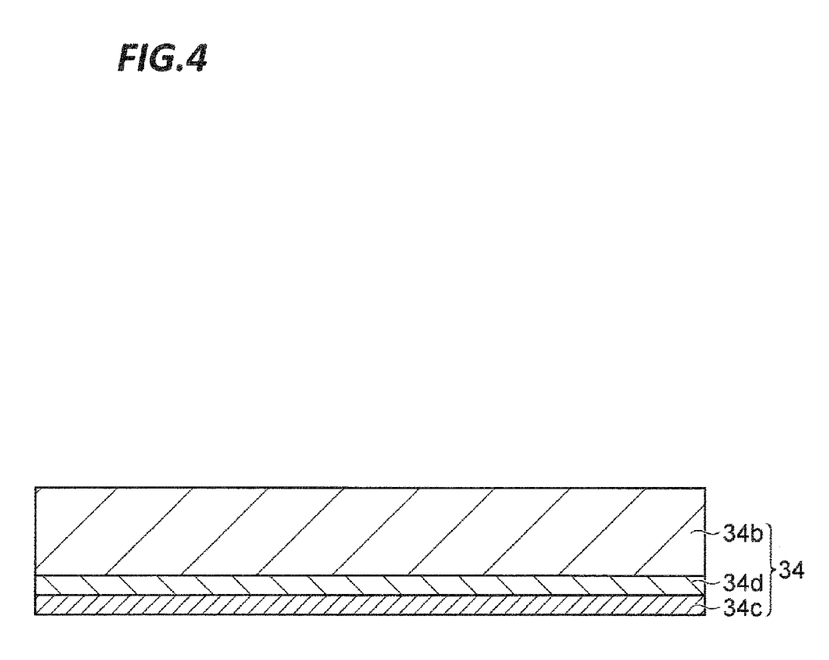
FIG. 4 is an enlarged cross-sectional view illustrating a top plate according to the exemplary embodiment.

Hereinafter, the top plate 34 will be described in detail. FIG. 4 is an enlarged cross-sectional view illustrating a top plate according to an exemplary embodiment. As illustrated in FIG. 4, the top plate 34 includes a base portion 34b. The base portion 34b is made of a conductor. In an example, the base portion 34b is made of aluminum. The base portion 34b includes a first covering portion 34d. The covering portion 34d is formed at least on the surface of the base portion 34b in the processing space S. The covering portion 34d is formed by an anodizing treatment for the base portion 34b. Further, the top plate 34 further includes a second covering portion 34c. The covering portion 34c is made of ceramics such as, for example, yttria ($Y_2O_3$), SiC, or YF, and is formed by, for example, ceramics thermal spraying. A thickness of the covering portion 34c is, for example, 200 nm or less.

In the plasma processing apparatus 10, the upper electrode 30, which includes the top plate 34, the support member 76, the baffle member 78, and the cylindrical member 72, is connected to the processing container 12. That is, the upper electrode 30, the support member 76, the baffle member 78, and the cylindrical member 72 have a potential that is the same as that of the processing container 12, and are grounded. Accordingly, the ions generated within the processing space S are attracted to the wafer W as well as the top plate 34, unlike the behavior of ions in a plasma processing apparatus including a flat top plate which is made of an insulator such as, for example, quartz. Accordingly, a material attached to the top plate 34 during etching in the plasma processing apparatus 10 can be removed.

Figure 5:
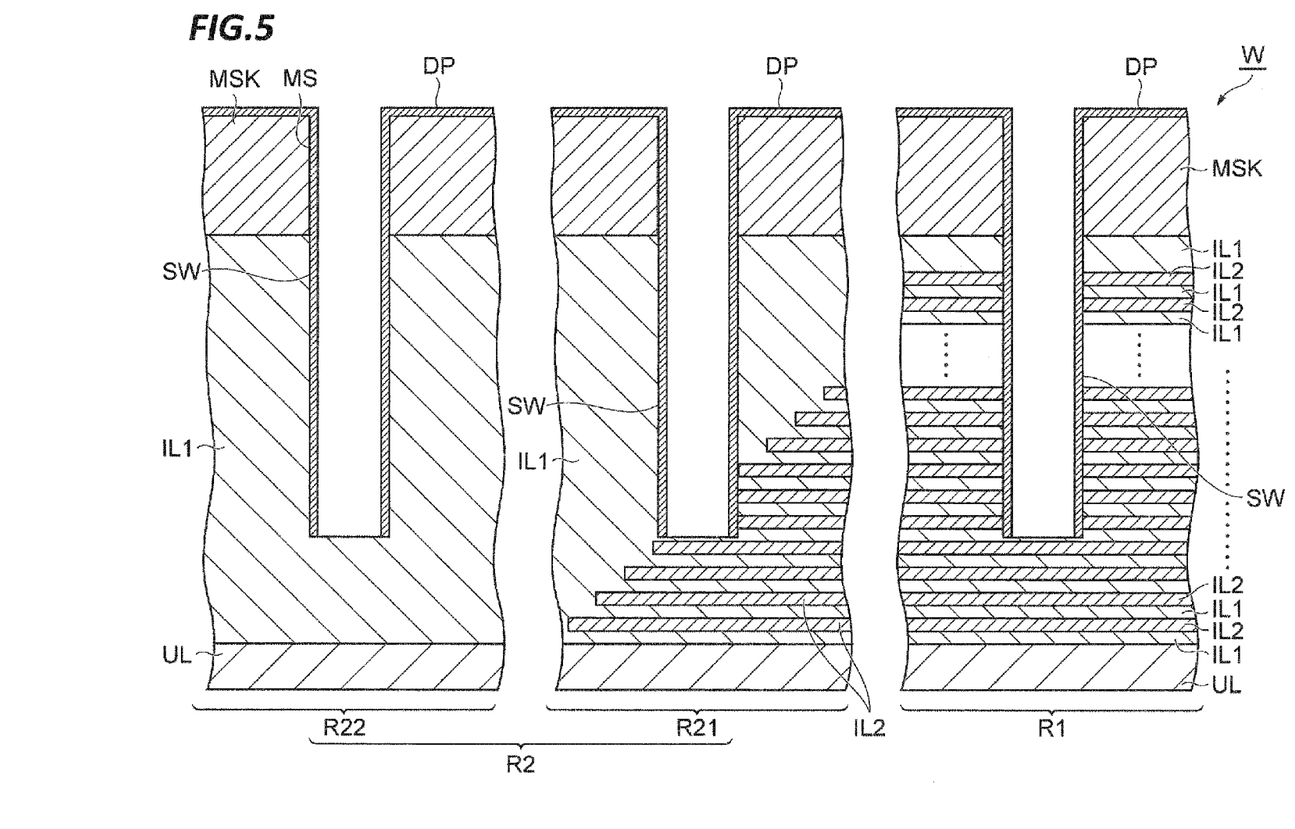
FIG. 5 is a cross-sectional view illustrating an example of a state of a workpiece in a step in the middle of execution of the method illustrated in FIG. 1.
Figure 6:
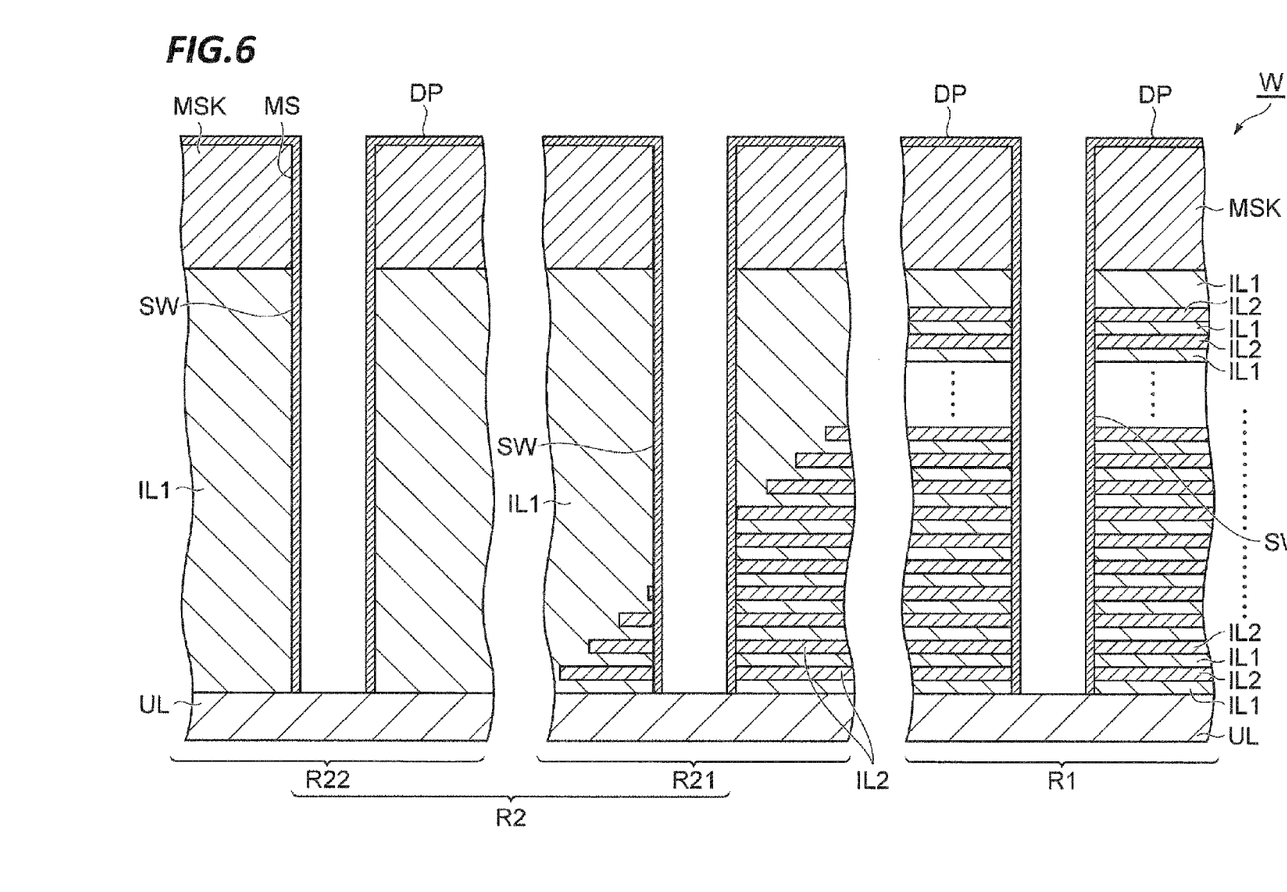
FIG. 6 is a cross-sectional view illustrating an example of a state of the workpiece after the execution of the method illustrated in FIG. 1.

Hereinafter, descriptions of the method MT will be continued with reference to FIG. 1 again. In the following descriptions, reference will also be made to FIGS. 5 and 6 as well as FIG. 1. FIG. 5 is a cross-sectional view illustrating an example of a state of a workpiece in a step in the middle of execution of the method illustrated in FIG. 1. FIG. 6 is a cross-sectional view illustrating an example of a state of the workpiece after the execution of the method illustrated in FIG. 1. Further, in the following description, the method MT will be described for a case where the plasma processing apparatus 10 is used, by way of an example.

In the method MT, as described above, the wafer W is carried into the processing container 12 of the plasma processing apparatus 10 first. The wafer W is placed on the placement table PD and held by the electrostatic chuck 18. Then, a sequence SQ is executed plural times in method MT. During each of the times of execution of sequence SQ, step ST1, step ST2, and step ST3 are executed.

At step ST1, plasma of the first processing gas is generated within the processing container 12. The first processing gas contains fluorocarbon gas, hydrofluorocarbon gas, and oxygen gas. In an example, the first processing gas may contain $C_4F_6$ gas, $C_4F_8$ gas, $CF_4$ gas, $CH_2F_2$ gas, and $O_2$ gas. Also, the first processing gas may contain other fluorocarbon gases and other hydrofluorocarbon gases. At step ST1, a high frequency power from the first high frequency power source 62 and a high frequency bias power from the second high frequency power source 64 are supplied to the lower electrode 16. Accordingly, the first processing gas is excited and the first region R1 and the second region R2 are etched by active species such as, for example, generated ions, in a portion exposed from the mask MSK.

At the subsequent step ST2, plasma of the second processing gas is generated within the processing container 12. The second processing gas contains fluorocarbon gas, hydrofluorocarbon gas, oxygen gas, and halogen-containing gas. In an example, the second processing gas may contain $C_4F_6$ gas, $C_4F_8$ gas, $CF_4$ gas, $CH_2F_2$ gas, $O_2$ gas, and HBr gas. Further, the second processing gas may contain other fluorocarbon gases and other hydrofluorocarbon gases. The second processing gas may contain other halogen-containing gases such as, for example, $BCl_3$ gas, $SiCl_4$ gas, and HI gas. At step ST2, the high frequency power from the first high frequency power source 62 and the high frequency bias power from the second high frequency power source 64 are supplied to the lower electrode 16. Accordingly, the second processing gas is excited and the first region R1 and the second region R2 are etched by active species such as, for example, generated ions, in a portion exposed from the mask MSK.

At next step ST3, plasma of the third processing gas is generated within the processing container 12. The third processing gas contains oxygen gas. The third processing gas may further contain a noble gas. In an example, the third processing gas may contain $O_2$ gas and Ar gas. Further, at step ST3, the high frequency power from the first high frequency power source 62 and the high frequency bias power from the second high frequency power source 64 are supplied to the lower electrode 16. Accordingly, the third processing gas is excited and active oxygen species are generated. Although the material, such as, for example, fluorocarbon, is attached to the surface of the mask MSK, excessive fluorocarbon are removed by the active oxygen species generated at step ST3.

The material such as, for example, fluorocarbon is attached especially to the surface of the mask MSK at step ST1 and step ST2 of the method MT. However, since oxygen gas is contained in the processing gas used at step ST1 and step ST2, the amount of the material attached to the surface of the mask MSK is reduced by the active oxygen species. The amount of the material attached to the surface of the mask MSK is also reduced by the plasma of oxygen gas generated at step ST3.

The second processing gas used at step ST2 contains halogen-containing gas. Accordingly, the silicon and the halogen element contained in the first region R1 and the second region R2 are reacted at step ST2, and the reaction product is attached to the wall surface formed by etching.

When the sequence SQ, which includes step ST1, step ST2, and step ST3, is executed, the first region R1 and the second region R2 are etched in a portion exposed from the opening of the mask MSK, as illustrated in FIG. 5. Further, a deposit DP is formed on the surface of the wafer W. The deposit DP on the surface MS of the mask MSK is mainly formed of a material such as, for example, fluorocarbon, and the deposit DP on the side wall surfaces SW, which are formed on the first region R1 and the second region R2 by etching, is mainly formed of the reaction product produced at step ST2. The deposit attached to the side wall surfaces SW, which are formed on the first region R1 and the second region R2 by etching, suppresses the side wall surfaces SW from being etched in the horizontal direction (in the direction perpendicular to film thickness direction). Accordingly, the verticality of the side wall surfaces SW is enhanced. Further, the deposit DP attached to the surface SM of the mask MSK, that is, the deposit formed of the material such as, for example, fluorocarbon, reduces wearing-away of the mask MSK. As described above, although the deposit DP attached to the surface SM of the mask MSK protects the mask MSK, an opening of the mask MSK is reduced in size, thereby impeding etching when the amount of the deposit is excessive. However, the amount of the deposit is appropriately reduced due to the active oxygen species produced at step ST1 and step ST2 in the method MT. Further, the excessive deposit attached to the surface of the mask MSK is also reduced by the active oxygen species produced at step ST3. Accordingly, an opening of the mask MSK is suppressed from being reduced in size by the method MT.

In the method MT, it is determined whether a stop condition is satisfied at step STJ after the sequence SQ is executed. When the number of times of execution of the sequence SQ reaches a predetermined number of times, it is determined that the stop condition is satisfied. When it is determined that the stop condition is not satisfied at step STJ, the sequence SQ is executed again from step ST1. In the meantime, when it is determined that the stop condition is satisfied at step STJ, the method MT is terminated. As described above, in the method MT, the sequence SQ is executed plural times such that the first region R1 and the second region R2 are etched until the space reaches the surface of the underlayer UL, as illustrated in FIG. 6.

Figure 7:
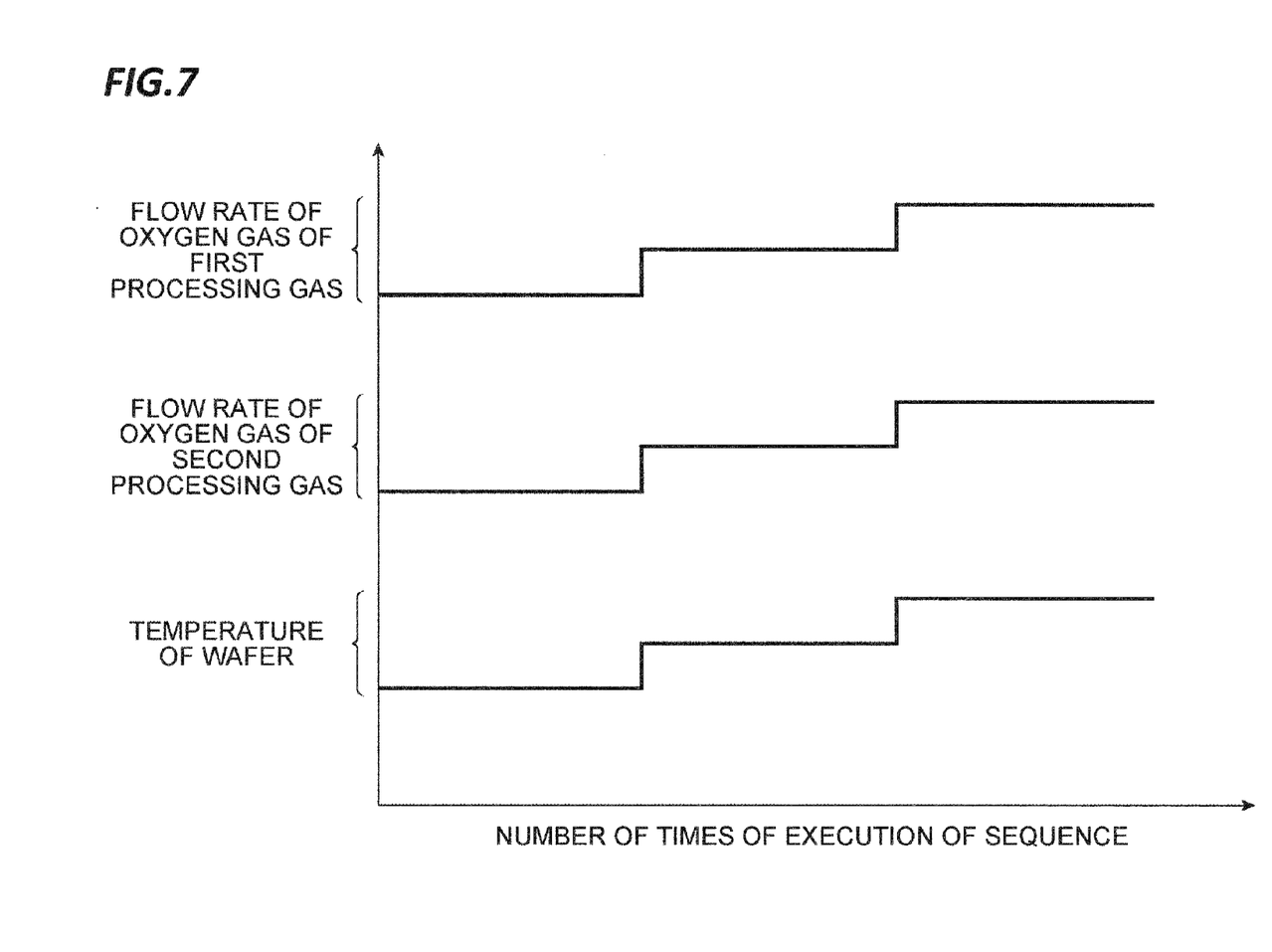
FIG. 7 is a diagram illustrating a relationship among a flow rate of oxygen gas in a first processing gas, a flow rate of oxygen gas in a second processing gas, a temperature of a workpiece (wafer), and the number of times of execution of a sequence.

Hereinafter, reference will be made to FIG. 7. FIG. 7 is a diagram representing a relationship, of a flow rate of oxygen gas of the first processing gas, a flow rate of oxygen gas of the second processing gas, a temperature of a workpiece (wafer), and the number of times of execution of a sequence. As illustrated in FIG. 7, in an exemplary embodiment of the method MT, the flow rate of oxygen gas of the first processing gas used at step ST1 and the flow rate of oxygen gas of the second processing gas used at step ST2 may be increased in stepwise manner as the number of times of execution of the sequence SQ is increased. In FIG. 7, the flow rate of oxygen gas of the first processing gas and the flow rate of oxygen gas of the second processing gas are increased in three steps as the number of times of execution of the sequence SQ is increased during the entire execution period of the method MT. However, the flow rate of oxygen gas of the first processing gas and the flow rate of oxygen gas of the second processing gas may be increased in any steps of two or more steps as the number of times of execution of the sequence SQ is increased during the entire execution period of the method MT.

In the method MT, the depth of the space formed in each of the first region R1 and the second region R2 is increased as the number of times of execution of the sequence SQ is increased. When the depth of the space is increased, fluorocarbon, which contributes to the etching, is easily attached to the wall surface in the vicinity of the opening of the mask MSK rather than infiltrating into a deep portion of the space. According to the exemplary embodiment, since the flow rate of the oxygen gas of the first processing gas and the flow rate of the oxygen gas of the second processing gas are increased as the number of times of execution of the sequence SQ is increased, it becomes possible to effectively remove materials deposited on the wall surface in the vicinity of the opening of the mask MSK when the space becomes deeper.

Further, in an exemplary embodiment of the method MT, the temperature of the wafer W may be increased as the number of times of execution of the sequence SQ is increased as illustrated in FIG. 7. In FIG. 7, the temperature of the wafer W may be increased in three steps as the number of times of execution of the sequence SQ is increased during the entire execution period of time of the method MT. However, the temperature of the wafer W may be increased in any steps of two or more steps as the number of times of execution of the sequence SQ is increased during the entire execution period of time of the method MT.

When the temperature of the wafer W is low, the amount of fluorocarbon attached to the wall surface in the vicinity of the opening of the mask MSK becomes larger than the amount of fluorocarbon infiltrating into the space formed in each of the first region R1 and the second region R2. In the meantime, when the temperature of the wafer W is high, the amount of fluorocarbon attached to the wall surface in the vicinity of the opening of the mask MSK is decreased and the amount of fluorocarbon infiltrating into the space formed in each of the first region R1 and the second region R2 is increased. In the exemplary embodiment, since the temperature of the wafer W is raised as the number of times of execution of the sequence SQ is increased, that is, as the depth of the space formed in each of the first region R1 and the second region R2 is increased, it is possible to suppress fluorocarbon from being attached to the wall surface in the vicinity of the opening of the mask MSK and to supply fluorocarbon up to the deep portion of the deep space. Accordingly, the etching of the deep space is more effectively performed.

Further, in an exemplary embodiment of the method MT, the second processing gas used at step ST2 may be a gas obtained by adding the above-mentioned halogen-containing gas to the first processing gas used at step ST1. That is, during each of the times of execution of the sequence, the first processing gas may be supplied into the processing container 12 over step ST1 and step ST2 without changing the flow rate of plural kinds of gases contained in the first processing gas and a minute amount of halogen-containing gas may be added to the first processing gas at step ST2. According to this exemplary embodiment, since the kinds of gases supplied over step ST1 and step ST2 are not largely changed, stable plasma generation is enabled.

Further, in an exemplary embodiment of the method MT, during each of the times of execution of the sequence SQ, the pressure within the processing container 12 may be kept constant and the high frequency power supplied from the first high frequency power source 62 to the lower electrode 16 and the high frequency bias power supplied from the second high frequency power source 64 to the lower electrode 16 may also be kept constant. That is, during each of the times of execution of the sequence SQ, the pressure within the processing container 12 may be kept constant and the high frequency power supplied from the first high frequency power source 62 to the lower electrode 16 and the bias power of high frequency supplied from the second high frequency power source 64 to the lower electrode 16 may also be kept constant over step ST1, step ST2, and step ST3. According to this exemplary embodiment, since the pressure, the high frequency power, and the bias power of high frequency are kept constant during the execution of each sequence SQ, it is possible to reduce the time required for making plasma stable during each inter-step transition between steps of step ST1 to step ST3. Furthermore, it becomes possible to reduce the time length of the entire period of the method MT.

In an exemplary embodiment of the method MT, the execution time length of step ST1 may be longer than that of step ST2. According to this exemplary embodiment, since the time length of step ST1 at which etching is mainly progressed becomes longer than the time length of step ST2 at which the deposit DP is formed during the execution period of each sequence SQ, the etching rate of each the sequence SQ is increased. As a result, it becomes possible to reduce the time length of the entire period of the method MT.

Further, the plasma processing apparatus 10 may be used in the method MT as described above. During the execution of the method MT, the material such as, for example, fluorocarbon is deposited on the surface abutting on the processing space S, (e.g., the surface of the top plate 34). In the plasma processing apparatus 10, the top plate 34 is connected to a ground potential and thus, ions generated in the processing space S are attracted to the top plate 34 as well as the wafer W. Accordingly, in the method MT, it becomes possible to remove the material attached to the top plate 34 using the plasma processing apparatus 10. Further, the surface of the top plate 34 is protected from plasma by the second covering portion 34c which is made of ceramics. Accordingly, the temporal degradation of the top plate 34 is suppressed.

Although various exemplary embodiments have been described, the present disclosure is not limited to the exemplary embodiments, and various modifications may be made thereto. For example, the method MT may be carried out not by the plasma processing apparatus 10, but by using an inductively-coupled plasma processing apparatus or any plasma processing apparatus using surface waves such as, for example, microwaves.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. An etching method comprising:
   providing a workpiece to be processed into a processing container of a plasma processing apparatus, the workpiece including a first region having a multilayered film configured by alternately laminating a silicon oxide film and a silicon nitride film, and a second region having a silicon oxide film having a film thickness that is larger than that of the silicon oxide film in the first region;
   providing a mask on the workpiece to provide an opening on each of the first region and the second region so that the first region and the second region of the workpiece are simultaneously etched;
   generating plasma of a first processing gas that contains fluorocarbon gas, hydrofluorocarbon gas, and oxygen gas, within the processing container of the plasma processing apparatus;
   generating plasma of a second processing gas that contains fluorocarbon gas, hydrofluorocarbon gas, oxygen gas, and a halogen-containing gas within the processing container of the plasma processing apparatus, the halogen-containing gas being a gas that forms a reaction product of a halogen element and silicon to form a deposit on a surface of the workpiece; and
   generating plasma of a third gas containing oxygen gas within the processing container of the plasma processing apparatus,
   wherein a sequence, which includes the generating the plasma of the first processing gas, the generating the plasma of the second processing gas, and the generating the plasma of the third processing gas, is executed plural times.

2. The etching method of claim 1, wherein a flow rate of the oxygen gas of the first processing gas and a flow rate of the oxygen gas of the second processing gas are increased in a stepwise manner as the number of times of execution of the sequence is increased.

3. The etching method of claim 2, wherein a temperature of the workpiece is increased in a stepwise manner as the number of times of execution of the sequence is increased.

4. The etching method of claim 2, wherein the second processing gas contains the first processing gas and the halogen-containing gas.

5. The etching method of claim 2, wherein an execution time of the generating the plasma of the first processing gas is longer than that of the generating the plasma of the second processing gas.

6. The etching method of claim 2, wherein a pressure inside the processing container and a power for generating plasma are maintained constant during each of the times of execution of the sequence.

7. The etching method of claim 1, wherein a temperature of the workpiece is increased in a stepwise manner as the number of times of execution of the sequence is increased.

8. The etching method of claim 7, wherein the second processing gas contains the first processing gas and the halogen-containing gas.

9. The etching method of claim 7, wherein an execution time of the generating the plasma of the first processing gas is longer than that of the generating the plasma of the second processing gas.

10. The etching method of claim 7, wherein a pressure inside the processing container and a power for generating plasma are maintained constant during each of the times of execution of the sequence.

11. The etching method of claim 1, wherein the second processing gas contains the first processing gas and the halogen-containing gas.

12. The etching method of claim 1, wherein an execution time of the generating the plasma of the first processing gas is longer than that of the generating the plasma of the second processing gas.

13. The etching method of claim 1, wherein a pressure inside the processing container and a power for generating plasma are maintained constant during each of the times of execution of the sequence.

14. The etching method of claim 13, wherein the second processing gas contains the first processing gas and the halogen-containing gas.

15. The etching method of claim 13, wherein an execution time of the generating the plasma of the first processing gas is longer than that of the generating the plasma of the second processing gas.

* * * * *